(12) United States Patent
Kim (10) Patent No.: US 10,727,425 B2
(45) Date of Patent: Jul. 28, 2020

(54) FOLDABLE DISPLAY DEVICE CAPABLE OF PREVENTING DAMAGE ON INTERNAL ELEMENTS CAUSED BY EXTERNAL IMPACT AND METHOD OF MANUFACTURING THE SAME

(71) Applicant: LG DISPLAY CO., LTD., Seoul (KR)

(72) Inventor: HongSik Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/177,151

(22) Filed: Oct. 31, 2018

(65) Prior Publication Data
US 2019/0140201 A1    May 9, 2019

(30) Foreign Application Priority Data
Oct. 31, 2017 (KR) .......................... 10-2017-0144134

(51) Int. Cl.
*H01L 51/00* (2006.01)
*H01L 51/52* (2006.01)
(Continued)

(52) U.S. Cl.
CPC .......... *H01L 51/0097* (2013.01); *G06F 3/044* (2013.01); *G06F 3/0443* (2019.05); *H01L 51/5246* (2013.01); *H01L 51/5253* (2013.01); *H01L 51/56* (2013.01); *G06F 2203/04102* (2013.01); *G06F 2203/04103* (2013.01); *H01L 27/1218* (2013.01); *H01L 27/323* (2013.01); *H01L 27/3244* (2013.01); *H01L 2227/323* (2013.01); *H01L 2251/5338* (2013.01)

(58) Field of Classification Search
CPC ............. H01L 51/0097; H01L 51/5253; H01L 51/5246; H01L 27/323
See application file for complete search history.

(56) References Cited

U.S. PATENT DOCUMENTS 9,655,235 B2    5/2017  Hwang et al.
2016/0338219 A1*  11/2016  Seo ...................... G06F 1/1652
2017/0269724 A1   9/2017  Son et al.

FOREIGN PATENT DOCUMENTS

KR    10-2013-0109350    10/2013
KR       20140010298 A     1/2014
(Continued)

OTHER PUBLICATIONS

Office Action dated Dec. 20, 2018 issued in the corresponding Korean Patent Application No. 10-2017-0144134, pp. 1-5.

*Primary Examiner* — Quoc D Hoang
(74) *Attorney, Agent, or Firm* — Polsinelli PC (57) ABSTRACT

A foldable display device and its manufacturing method are disclosed, in which a flexible cover plastic is used as a cover window and internal elements may be prevented from being damaged due to external impact. The foldable display device comprising a thin film transistor substrate; a first adhesive layer arranged on the thin film transistor substrate; a second adhesive layer arranged outside the first adhesive layer on the thin film transistor substrate; and a touch substrate arranged on the first and second adhesive layers, wherein the second adhesive layer includes a rigid material and is arranged on areas outside the first adhesive layer except a folding area where the thin film transistor substrate is folded.

25 Claims, 9 Drawing Sheets

(51) Int. Cl.
   *H01L 51/56*   (2006.01)
   *G06F 3/044*   (2006.01)
   *H01L 27/32*   (2006.01)
   *H01L 27/12*   (2006.01)

(56) References Cited

FOREIGN PATENT DOCUMENTS

| KR | 10-2014-0015881 | 2/2014 |
| KR | 20140013482 A | 2/2014 |
| KR | 20170064453 A | 6/2017 |
| KR | 20170072973 A | 6/2017 |
| KR | 10-2017-0109134 | 9/2017 |

* cited by examiner

FOLDABLE DISPLAY DEVICE CAPABLE OF PREVENTING DAMAGE ON INTERNAL ELEMENTS CAUSED BY EXTERNAL IMPACT AND METHOD OF MANUFACTURING THE SAME

CROSS REFERENCE TO RELATED APPLICATION

This application claims the priority of Korean Patent Application No. 10-2017-0144134 filed in the Republic of Korea on Oct. 31, 2017, which is hereby incorporated by reference in its entirety.

BACKGROUND

Field of the Disclosure

The present disclosure relates to a foldable display device and its manufacturing method.

Description of the Background

The importance of a display device has increased with the advancement of multimedia. Various types of display devices such as a liquid crystal display device, a plasma display device, and an organic light emitting display device have been commercialized and widely used for notebook computers, televisions, tablet computers, monitors, smartphones, portable display apparatus, and portable information apparatus, etc.

Also, a foldable display device has recently developed. A foldable display device may bend or curve a display device for users' convenience. Since a display area for displaying images may be bent or curved, various forms of images may be realized.

For a foldable display device, transistors and lines for forming pixels in a display area and a substrate for forming a display device should have flexibility. That is, for a foldable display device, materials of the used parts basically should have flexibility to realize a folding function. Therefore, a cover glass that is used as a top cover in general display devices cannot be used for a folding display device. Instead, a cover of a flexible plastic type that has high flexibility and thus is capable of folding is used. In such case, since a cover plastic is used as a cover window, a problem occurs in that a function of protecting internal elements from external impact is weakened.

SUMMARY

The present disclosure has been made in view of the above problems, and is to provide a foldable display device and its manufacturing method, in which a flexible cover plastic is used as a cover window and internal elements may be prevented from being damaged due to external impact.

In accordance with an aspect of the present disclosure, the above and other objects can be accomplished by the provision of a foldable display device comprising a thin film transistor substrate; a first adhesive layer arranged on the thin film transistor substrate; a second adhesive layer arranged outside the first adhesive layer on the thin film transistor substrate; and a touch substrate arranged on the first and second adhesive layers, wherein the second adhesive layer includes a rigid material and is arranged on areas outside the first adhesive layer except a folding area where the thin film transistor substrate is folded.

BRIEF DESCRIPTION

The above and other objects, features and other advantages of the present disclosure will be more clearly understood from the following detailed description taken in conjunction with the accompanying drawings, in which.

DETAILED DESCRIPTION

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, aspects of an electronic apparatus according to the present disclosure will be described in detail with reference to the accompanying drawings. Wherever possible, the same reference numbers will be used throughout the drawings to refer to the same or like parts.

Figure 1:
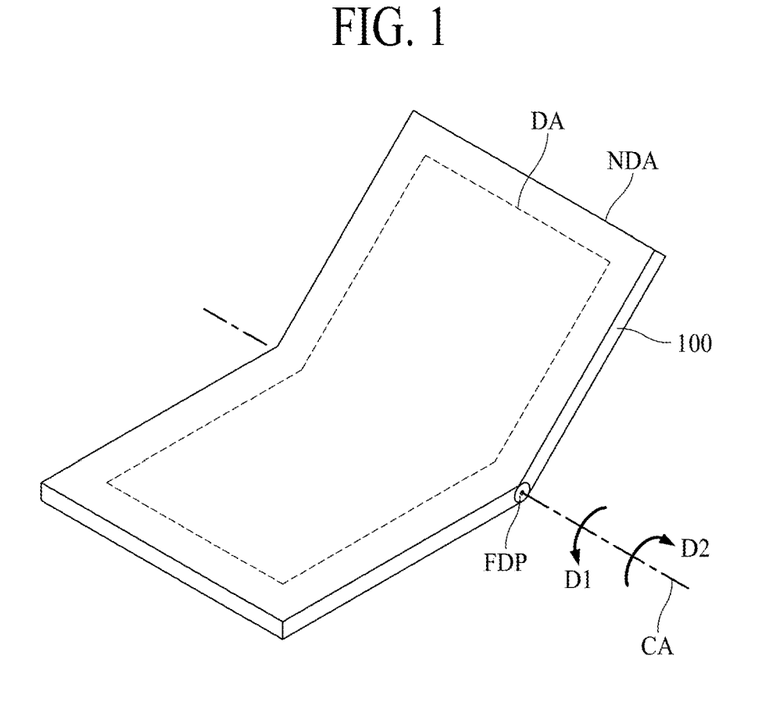
FIG. 1 is a block view illustrating a foldable display device according to an aspect of the present disclosure.

FIG. 1 is a block view illustrating a foldable display device according to an aspect of the present disclosure. A foldable display device according to an aspect of the present disclosure includes a thin film transistor substrate 100, a display area DA, a folding point FDP, and a central axis CA.

The thin film transistor substrate 100 means all kinds of display substrates for displaying images using a transistor circuit. The foldable display device according to the present disclosure may be realized as an organic light emitting display. However, without limitation to this example, the foldable display device according to the present disclosure may be applied to a quantum dot display device, a micro light emitting diode (μ-LED) display device, etc.

The display area DA is an area for displaying images. The display area DA is provided on an entire surface of the thin film transistor substrate 100. Pixels may be provided on the display area DA to display images.

The folding point PDP is a point where the thin film transistor substrate is bent and folded. The folding point FDP is formed on the point where the thin film transistor substrate 100 and the display area DA are folded. For example, when a central part of the thin film transistor substrate 100 is bent, the folding point FDP may be formed to pass the central part of the display area DA and the thin film transistor substrate 100.

The central axis CA is a virtual straight-line that passes the folding point FDP. The central axis CA is formed to cross the inside of the thin film transistor substrate 100. The central axis CA allows the thin film transistor substrate 100 to be bent in a first direction D1 or a second direction D2 in a state that the thin film transistor substrate 100 has a predetermined curvature. For example, when the thin film transistor substrate 100 is bent by rotating the folding point FDP in the first direction D1 based on the central axis CA, images may be displayed while the display area DA is maintained to be folded into inner surface of the thin film transistor substrate 100 or is inclined to have a predetermined angle. Also, when the thin film transistor substrate 100 is unfolded on a plane by rotating the folding point FDP in the second direction D2 based on the central axis CA, images may be displayed in a state that the display area DA is unfolded on a plane.

Figure 2:
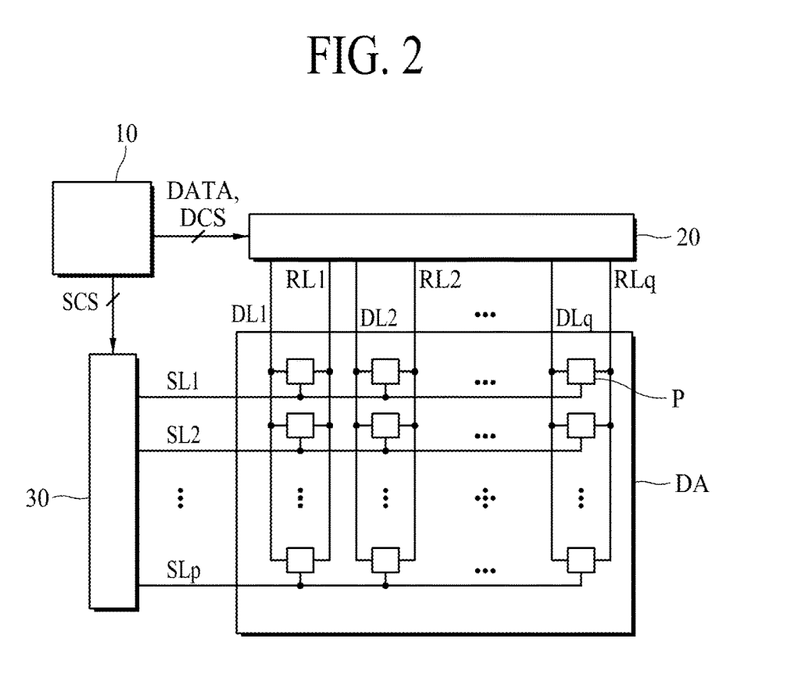
FIG. 2 is a block view illustrating a foldable display device according to an aspect of the present disclosure.

FIG. 2 is a block view illustrating a foldable display device according to one aspect of the present disclosure. The foldable display device according to one aspect of the present disclosure includes a display are DA, a timing controller 10, a data driver 20, and a gate driver 30. Although a block view according to a function is shown in FIG. 2, the timing controller 10, the data driver 20, and the gate driver 30 may be realized as driver integrated circuit (IC) which is a single driver chip packaged in an external area of the display area DA of an organic light emitting display device.

On the display area DA, scan lines SL1 to SLp (p is a positive integer of 2 or more) for supplying scan signals, data lines DL1 to DLq (q is a positive integer of 2 or more) for supplying data voltages, and driving power lines RL1 to RLq for supplying a driving power are arranged. The data lines DL1 to DLq and driving power lines RL1 to RLq may cross the scan lines SL1 to SLp. The data lines DL1 to DLq may be parallel with the driving power lines RL1 to RLq. The display area DA may include a lower substrate where pixels are arranged and an upper substrate for performing an encapsulation function.

Each of pixels P may be connected with any one of the scan lines SL1 to SLp, any one of the data lines DL1 to DLq, and any one of the driving power lines RL1 to RLq. Each of the pixels P may include an organic light emitting diode OLED and a pixel circuit for supplying a current to the organic light emitting diode OLED.

The timing controller 10 generates digital video data DATA for realizing images on the organic light emitting display device and timing signals for controlling a driving timing of the organic light emitting display device. The timing signals include a vertical sync signal, a horizontal sync signal, a data enable signal, and a dot clock.

The timing controller 10 generates a data control signal DCS for controlling an operation timing of the data drive 20 using the timing signals and a scan control signal SCS for controlling an operation timing of the gate drive 30. The timing controller 10 outputs the digital video data DATA and the data control signal DCS to the data driver 20. The timing controller 10 outputs the scan control signal SCS to the gate drive 30.

The data driver 20 receives the data control signal DCS from the timing controller 10. The data driver 20 generates data voltages based on the data control signal DCS. The data driver 20 supplies the data voltages to the data lines DL1 to DLq.

The gate driver 30 receives the scan control signal SCS from the timing controller 10. The gate driver 30 generates scan signals based on the scan control signal SCS. The gate driver 30 supplies the scan signals to the scan lines SL1 to SLp.

As described above, the timing controller 10, the data driver 20, and the gate driver 30 are packaged in the external area of the display area DA of the organic light emitting display device. In this case, the timing controller 10, the data driver 20, and the gate driver 30 may be packaged in the non-display area NDA which is an external area surrounding the display area DA by a gate drive in panel (GIP) method.

The driver IC in which the data driver 20 and the gate driver 30 are packaged may be connected to a flexible printed circuit board (FPCB). The flexible printed circuit board may be attached to a front edge area and a rear edge area inside the organic light emitting display device.

In this case, the timing controller 10 may be packaged on the flexible printed circuit board, and the data control signal DCS and the scan control signal SCS may be transferred from a control printed circuit board to the driver IC. The flexible printed circuit board is arranged at the edge area inside the organic light emitting display device in a folded state. Therefore, the flexible printed circuit board may be packaged even without providing a separate space inside the organic light emitting display device. Also, if the timing controller 10 is packaged on the flexible printed circuit board, a function performed by a circuit inside the driver IC may be reduced, whereby the size of the driver IC may be reduced.

Figure 3:
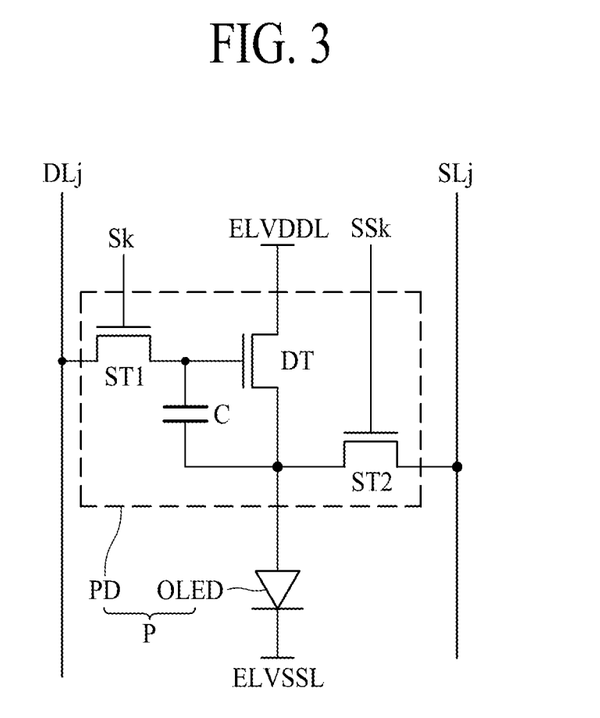
FIG. 3 is a circuit view illustrating pixels of FIG. 2.

FIG. 3 is a circuit view illustrating pixels P of FIG. 2. Each of the pixels P includes an organic light emitting diode OLED and a pixel driver PD. In FIG. 3, only the pixel P connected to the jth data line DLj (j is a positive integer that satisfies 1≤j≤q), the jth sensing line SLj, the kth scan line Sk (k is a positive integer that satisfies 1≤k≤p), and the kth sensing signal line SSk is shown for convenience of description. The kth scan line Sk and the kth sensing signal line SSk are included in the kth gate line GLk.

The organic light emitting diode OLED emits light in accordance with the current supplied through the driving transistor DT. The anode electrode of the organic light emitting diode OLED may be connected to the source electrode of the driving transistor DT, and the cathode electrode may be connected to a low potential voltage line ELVSSL to which a low potential voltage ELVSS is supplied.

The organic light emitting diode OLED may include an anode electrode, a hole transporting layer, an organic light emitting layer, an electron transporting layer, and a cathode electrode. When a voltage is applied to the anode electrode and the cathode electrode, holes and electrons are transferred to the organic light emitting layer through the hole transporting layer and the electron transporting layer, respectively, and then the organic light emitting diode emits light after the holes and the electrons are combined with each other in the organic light emitting layer.

The pixel driver PD supplies a current to the organic light emitting diode OLED and the jth sensing line SLj. The pixel driver PD may include a driving transistor DT, a first transistor ST1 controlled by a scan signal of the scan line Sk, a second transistor ST2 controlled by a sensing signal of the sensing signal line SSk, and a capacitor C.

The pixel driver PD receives a data voltage VDATA of the data line DLj connected to the pixel P when the scan signal is supplied from the scan line Sk connected to the pixel P in a display mode, and supplies a current of the driving transistor DT based on the data voltage VDATA to the organic light emitting diode OLED. When the sensing signal is supplied from the sensing signal line SSk connected to the pixel P in a sensing mode, the pixel driver PD allows the current of the driving transistor DT to flow to the sensing line SLj connected to the pixel P.

The driving transistor DT is provided between a high potential voltage line ELVDDL and the organic light emitting diode OLED. The driving transistor DT adjusts the current flowing from the high potential voltage line ELVDDL to the organic light emitting diode OLED in accordance with a voltage difference between a gate electrode and a source electrode. The gate electrode of the driving transistor DT may be connected to a first electrode of the first transistor ST1, the source electrode may be connected to anode electrode of the organic light emitting diode OLED, and the drain electrode may be connected to the high potential voltage line ELVDDL to which a high potential voltage ELVDD is supplied.

The first transistor ST1 is turned on by the kth scan signal of the kth scan line Sk and then supplies the voltage of the jth data line DLj to the gate electrode of the driving transistor DT. The gate electrode of the first transistor T1 may be connected to the kth scan line Sk, the first electrode may be connected to the gate electrode of the driving transistor DT, and the second electrode may be connected to the jth data line DLj. The first transistor ST1 may be referred to as a scan transistor.

The second transistor ST2 is turned on by the kth sensing signal of the kth sensing signal line SSk and then connects the jth sensing line SLj to the source electrode of the driving transistor DT. The gate electrode of the second transistor ST2 may be connected to the kth sensing signal line SSk, the first electrode may be connected to the jth sensing line SLj, and the second electrode may be connected to the source electrode of the driving transistor DT. The second transistor ST2 may be referred to as a sensing transistor.

The capacitor C is provided between the gate electrode and the source electrode of the driving transistor DT. The capacitor C stores a differential voltage between the gate voltage and the source voltage of the driving transistor DT.

Although the description of FIG. 2 is given based on that the driving transistor DT and the first and second transistors ST1 and ST2 are formed as N type MOSFET (Metal Oxide Semiconductor Field Effect Transistor), it is to be understood that the present disclosure is not limited to the example of FIG. 2. The driving transistor DT and the first and second transistors ST1 and ST2 may be formed as P type MOSFET (Metal Oxide Semiconductor Field Effect Transistor). Also, although the first electrode may be the source electrode and the second electrode may be the drain electrode, it is to be understood that the present disclosure is not limited to this example. That is, the first electrode may be the drain electrode and the second electrode may be the source electrode In a display mode, when the scan signal is supplied to the kth scan line Sk, the data voltage VDATA of the jth data line DLj is supplied to the gate electrode of the driving transistor DT, and when the sensing signal is supplied to the kth sensing signal line SSk, an initialization voltage of the jth sensing line SEj is supplied to the source electrode of the driving transistor DT. For this reason, the current of the driving transistor DT flowing along a voltage difference between a voltage of the gate electrode and a voltage of the source electrode of the driving transistor DT in the display mode is supplied to the organic light emitting diode OLED, and the organic light emitting diode OLED emits light in accordance with the current of the driving transistor DT. In this case, since the data voltage VDATA is a voltage compensating for a threshold voltage and electron mobility of the driving transistor DT, the current of the driving transistor DT does not depend on the threshold voltage and electron mobility of the driving transistor DT.

In a sensing mode, when the scan signal is supplied to the kth scan line Sk, the sensing voltage of the jth data line DLj is supplied to the gate electrode of the driving transistor DT, and when the sensing signal is supplied to the kth sensing signal line SSk, an initialization voltage of the jth sensing line SLj is supplied to the source electrode of the driving transistor DT. Also, when the sensing signal is supplied to the kth sensing signal line SSk, the second transistor is turned on and then the current of the driving transistor DT flowing in accordance with a voltage difference between a voltage of the gate electrode and a voltage of the source electrode of the driving transistor DT flows to the jth sensing line SLj.

Figure 4:
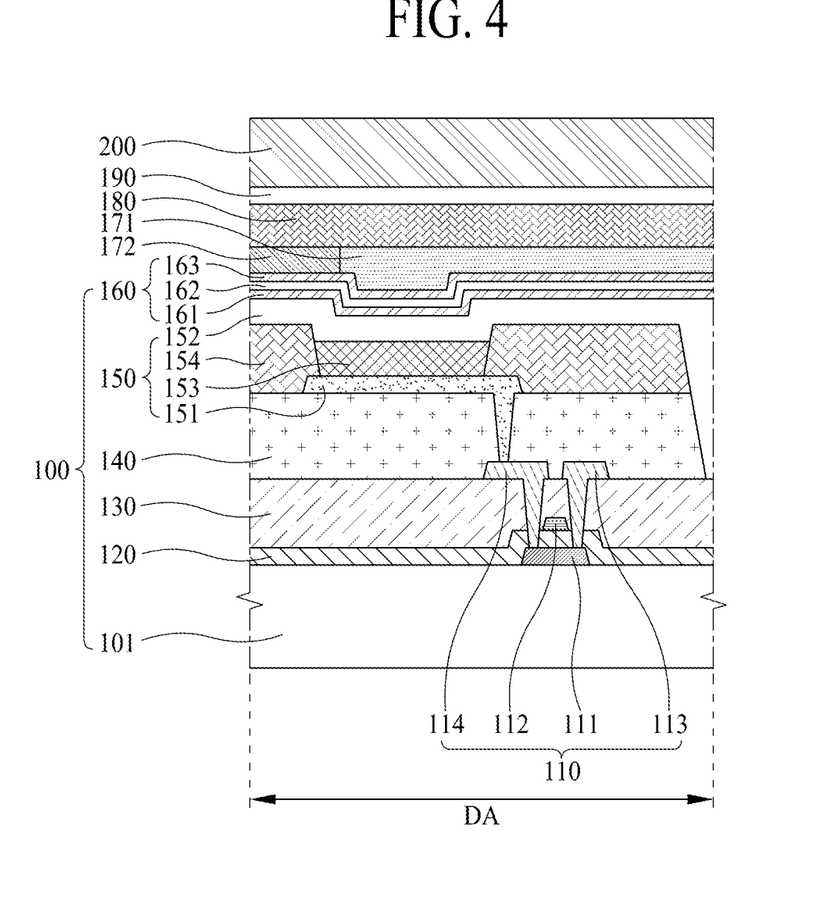
FIG. 4 is a cross-sectional view illustrating a foldable display device according to the present disclosure.
Figure 5:
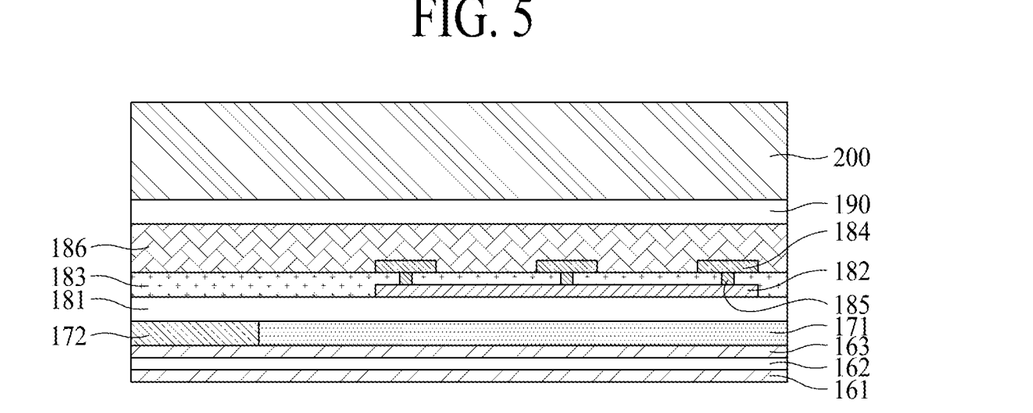
FIG. 5 is a cross-sectional view specifically illustrating a first inorganic film, an organic film, a second inorganic film, first and second adhesive layers, a touch substrate, a polarizing film, and a cover window of a foldable display device according to the present disclosure.

FIG. 4 is a cross-sectional view illustrating a foldable display device according to the present disclosure. FIG. 5 is a cross-sectional view specifically illustrating a first inorganic film, an organic film, second inorganic films 161, 162 and 163, first and second adhesive layers 171 and 172, a touch substrate 180, a polarizing film 190, and a cover window 200 of the foldable display device according to the present disclosure.

The thin film transistor substrate 100 includes a thin film transistor 110, an inter-layer dielectric film 120, a gate insulating film 130, a planarization film 140, a light emitting diode layer 150, and an encapsulation layer 160.

Each of the transistors 110 includes a semiconductor layer 111, a gate electrode 112, a source electrode 113, and a drain electrode 114.

The inter-layer dielectric film 120 may be provided on the semiconductor layer 111. The gate electrode 112 may be provided on the inter-layer dielectric film 120. The gate insulating film 130 may be provided on the gate electrode 112. The source electrode 113 and the drain electrode 114 may be provided on the gate insulating film 130. Each of the source electrode 113 and the drain electrode 114 may be connected to the semiconductor layer 111 through a contact hole passing through the inter-layer dielectric film 120 and the gate insulating film 130.

The planarization film 140 is provided on the thin film transistor 110 to planarize pixels partitioned by banks 154. The pixels include an anode electrode 151 exposed between the banks 154, a light emitting layer 153 provided on the anode electrode 151, a thin film transistor 110 where the anode electrode 151 is connected to the drain electrode 114. The light emitting diode layer 150 is provided on the planarization film 140.

The light emitting diode layer 150 includes an anode electrode 151, a light emitting layer 153, a cathode electrode 152, and a bank 154. The anode electrode 151 and the light emitting layer 153 may be provided on the display area, and the cathode electrode 152 and the bank 154 may be provided on the display area and the non-display area NDA.

Each of the anode electrodes 151 is connected to the drain electrode through a contact hole passing through the planarization film 140.

The light emitting layers 153 are provided on the anode electrodes 151 exposed between the banks 154 on the display area DA. Since a height of each of the banks 154 is higher than a height of each of the light emitting layers 153, the light emitting layers 153 are partitioned by the banks 154. That is, each of the light emitting layers 153 is arranged between the banks 154.

The cathode electrode 152 is provided on the light emitting layers 153 and the banks 154 to cover the light emitting layers 153 and the banks 154 on the display area.

The encapsulation layer 160 is formed on the cathode electrode 152. The encapsulation layer 160 serves to prevent permeation of oxygen or water from occurring. It is exemplified that the encapsulation layer 160 includes a first inorganic film 161, an organic film 162, and a second inorganic film 163. However, without limitation to this example, the encapsulation layer 160 may be formed such that inorganic film and organic film less than or greater than this example are deposited alternately.

The first inorganic film 161 is provided on the cathode electrode 152 to cover the cathode electrode 152. The organic film 162 is provided on the first inorganic film 161 to prevent water and oxygen from being permeated into the light emitting layer 153 and the cathode electrode 152 by passing through the first inorganic film 161. The second inorganic film 163 is provided on the organic film 162 to cover the organic film. The first inorganic film, the organic film, and the second inorganic films 161, 162 and 163 are sequentially deposited to form the encapsulation layer 160.

Each of the first and second inorganic films 161 and 163 may be formed of a material of a silicon nitride, an aluminum nitride, a titanium nitride, a silicon oxide, an aluminum oxide, or a titanium oxide. For example, each of the first and second inorganic films 161 and 163 may be formed of $SiN_x$, $SiO_2$, $Al_2O_3$, or $TiO_2$.

The first adhesive layer 171 is provided on the encapsulation layer 160. The first adhesive layer 171 is formed on areas except edge areas on an upper surface of the encapsulation layer 160. The first adhesive layer 171 bonds the thin film transistor substrate 100 to the touch substrate 180. The first adhesive layer 171 is made of an adhesive flexible material.

The second adhesive layer 172 is provided on the encapsulation layer 160. The second adhesive layer 172 is formed on edge areas of an upper surface of the encapsulation layer 160. The second adhesive layer 172 is arranged outside the first adhesive layer 171. The second adhesive layer 172 prevents the thin film transistor substrate 100 and the touch substrate 180 from moving. The second adhesive layer 172 is made of adhesive materials. The second adhesive layer 172 includes a rigid material.

The rigid material is defined as a material of which rigidity is greater than 100 N/m and less than 10000 N/m.

Rigidity of a random material defines a level to resist to transformation of the material when the material is subjected to elastic transformation, and may be defined as stiffness. The rigid material has hardness greater than 1 kg/mm² and less than 5 kg/mm² based on the Brinell hardness, wherein the hardness is a stiffness to resist to a force to break a solid material. The Brinell hardness is a value of a required load (kg) divided by a surface area (mm²) of an irregular mark to leave the irregular mark on a testing surface of a material using a hammer.

Therefore, the rigid material does not have much flexibility and restricts a movement or mobility of a peripheral element or an adjacent layer. Therefore, the second adhesive layer 172 including a rigid material may minimize external impact applied to the thin film transistor substrate 100 by preventing the thin film transistor substrate 100 and the touch substrate 180 from moving.

In this case, the second adhesive layer 172 is arranged on areas except a folding area at the outside of the first adhesive layer 171. The folding area is an area adjacent to a folding point FDP of the non-display area NDA arranged on the entire surface of the thin film transistor substrate 100. If the second adhesive layer 12 is arranged on the folding area, a bending capability of the folding area is reduced due to a rigid material of the second adhesive layer 172. Therefore, although the second adhesive layer 172 is arranged on areas except the folding area for a rigid enforcement against impact, the second adhesive layer 172 is not arranged on the folding area to maintain a bending capability of the folding area.

The second adhesive layer 172 is arranged to be adjacent to the first adhesive layer 171. The second adhesive layer 172 is arranged from a boundary line where the first adhesive layer 171 is not arranged to an external boundary line of the thin film transistor substrate 100 without a gap. A side of the second adhesive layer 172 is in contact with a side of the first adhesive layer 171. That is, the second adhesive layer 172 is arranged to be directly in contact with the first adhesive layer 171. Therefore, the second adhesive layer 172 may be attached to the first adhesive layer 171, whereby the thin film transistor substrate 100 and the touch substrate 180 may be prevented from being spaced apart from or coming off the edge area more certainly.

The touch substrate 180 is arranged on the first and second adhesive layers 171 and 172. The touch substrate 180 may display touch information on the display area by recognizing a user's touch. The touch substrate 180 includes a passivation layer 181, a first touch electrode 182, a first insulating film 183, a second touch electrode 184, a connection electrode 185, and a second insulating film 186.

The passivation layer 181 is arranged on the first and second adhesive layers 171 and 172. The passivation layer 181 may prevent physical or electric interference between elements of the first and second adhesive layers 171 and 172 and the touch substrate 180 from occurring. The passivation layer 181 may be formed of a material with low electric conductivity. Also, the passivation layer 181 may provide a change in capacitance due to a touch so that the touch substrate 180 may perform a touch function. The passivation layer 181 may be formed of a material with a relative dielectric rate greater than 2.5 and less than 3.5.

The first touch electrode 182 is arranged on the passivation layer 181. The first touch electrode 182 serves as a bridge electrode electrically connecting the second touch electrodes 184 with each other.

The first electrode insulating film 183 is arranged on the passivation layer 181 and the first touch electrode 182. The first electrode insulating film 183 is formed of a material with low electric conductivity. The first electrode insulating film 183 prevents short-circuit of the first and second touch electrodes 182 and 184 from occurring.

The second touch electrode 184 is arranged on the first electrode insulating film 183. The second touch electrode 184 is partitioned per a plurality of areas. Each of the areas includes a plurality of pixels. The second touch electrode 184 is separated from the first touch electrode 182 through the first electrode insulating film 183. Also, the second touch electrodes 184 are separated from each other. Each of the second touch electrodes 184 recognizes whether there is a user's touch on its arranged location and generates a touch signal in case of occurrence of a touch.

The connection electrode 185 is arranged on the first touch electrode 182. The connection electrode 185 electrically connects the first touch electrode 182 with the second touch electrode 184.

The second electrode insulating film 186 is arranged on the second touch electrode 184. The second electrode insulating film 186 is formed of a material with low electric conductivity. The second electrode insulating film 186 prevents short-circuit between the second touch electrode 184 and the polarizing film 190 from occurring.

The polarizing film 190 is arranged on the touch substrate 180. The polarizing film 190 has a particular polarized angle. The polarizing film 190 polarizes light emitted from the light emitting diode layer 150 at a polarized angle. The polarizing film 190 emits the polarized light to the outside at a polarized angle. The polarizing film 190 may include a function to block reflection of external light except the polarized light at a polarized angle. The polarizing film 190 may be realized as a polarizing film for thinness and flexibility of the foldable display device.

The cover window 200 is arranged on the polarizing film 190. The cover window 200 protects the thin film transistor substrate 100 and the touch substrate 180 from external impact. The cover window 200 may be realized as a cover of a flexible plastic type that can be folded for thinness and flexibility of the foldable display device. Therefore, the cover window 200 of the foldable display device is referred to as a cover plastic.

Figure 6:
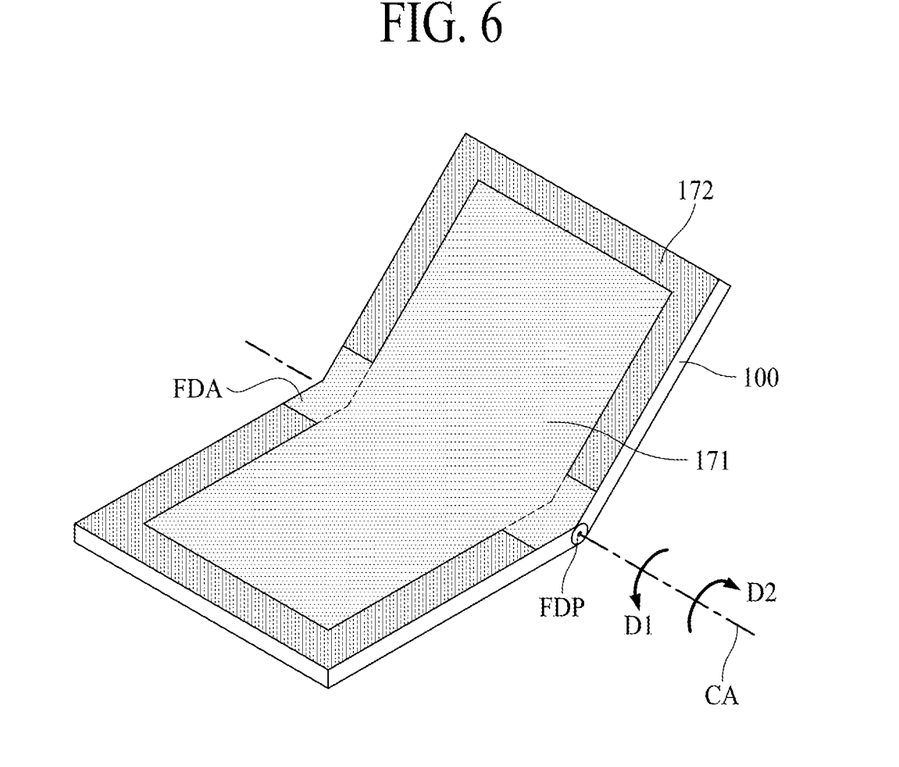
FIG. 6 is a perspective view illustrating a thin film transistor substrate, a first adhesive layer, and a second adhesive layer of a foldable display device according to the present disclosure.

FIG. 6 is a perspective view illustrating a thin film transistor substrate 100, a first adhesive layer 171, and a second adhesive layer 172 of a foldable display device according to the present disclosure.

The first adhesive layer 171 according to the present disclosure is fully arranged on the display area DA and the folding area FDA. The first adhesive layer 171 is arranged on the display area DA and therefore, is formed of a transparent material. Also, the first adhesive layer 171 is arranged on the folding area FDA and therefore, is formed of a flexible material so as not to interrupt bending of the folding area FDA.

The second adhesive layer 172 according to the present disclosure is arranged on the entire surface of the thin film transistor substrate 100. The second adhesive layer 172 is arranged on the edge areas of the thin film transistor substrate 100, along with an outer line of the thin film transistor substrate 100. The second adhesive layer 172 is arranged outside the display area DA. The second adhesive layer 172 bonds the touch substrate 180 arranged on the entire surface with the thin film transistor substrate 100. Therefore, the second adhesive layer 172 may minimize impact applied to the entire surface of the thin film transistor substrate 100 by preventing the thin film transistor substrate 100 or the touch substrate 180 from moving.

Also, the second adhesive layer 172 serves as a barrier by including a rigid material. That is, the second adhesive layer 172 does not move by external impact. Therefore, the second adhesive layer 172 may also reduce impact applied from the side of the thin film transistor substrate 100.

Also, the second adhesive layer 172 is arranged on outer areas of the thin film transistor substrate 100 except the folding area FDA. The folding area FDA is an area where the thin film transistor substrate 100 is bent, and is an area adjacent to the folding point FDP of the non-display area NDA. If the second adhesive layer 172 is arranged on the folding area FDA, flexibility of the folding area FDA is reduced and therefore bending of the thin film transistor substrate 100 is restricted. In the folding area FDA, since it is more important that the thin film transistor substrate 100 maintains a bending capability than prevention of external impact, the second adhesive layer 172 is not arranged.

Figure 7:
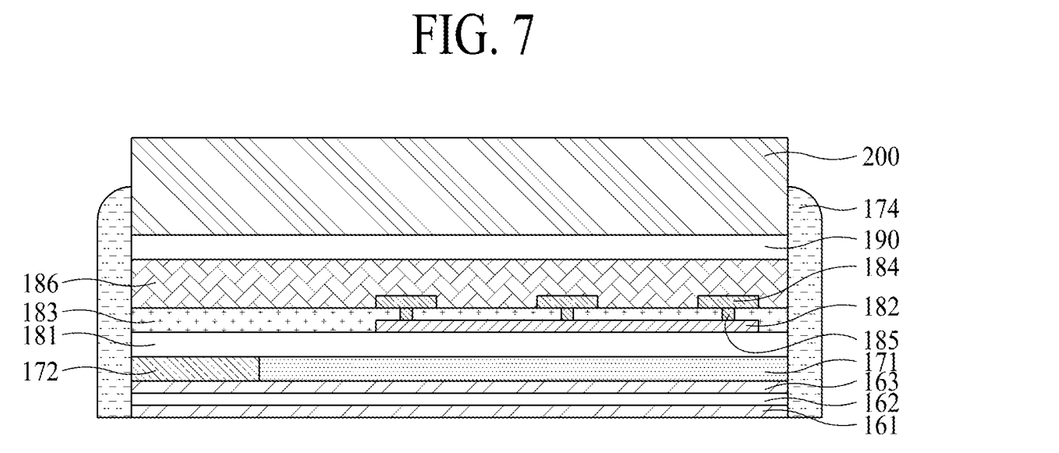
FIG. 7 is a cross-sectional view specifically illustrating a first inorganic film, an organic film, a second inorganic film, first to third adhesive layers, a touch substrate, a polarizing film, and a cover window of a foldable display device according to another aspect of the present disclosure.

FIG. 7 is a cross-sectional view specifically illustrating a first inorganic film, an organic film, second inorganic films 161, 162 and 163, first to third adhesive layers 171, 172 and 174, a touch substrate 180, a polarizing film 190, and a cover window 200 of a foldable display device according to another aspect of the present disclosure. Since the foldable display device according to another aspect of the present disclosure is the same as the foldable display device according to one aspect of the present disclosure described with reference to FIG. 5 except the third adhesive layer 174, description of repeated elements will be omitted.

The third adhesive layer 174 is arranged on sides of the first inorganic film, the organic film, the second inorganic films 161, 162 and 163, the first and second adhesive layers 171 and 172, and the touch substrate 180. That is, the third adhesive layer 174 is arranged on the side of the thin film transistor substrate 100 and the side of the touch substrate 180.

The third adhesive layer 174 is formed through a side sealing process. To realize a fixing structure of the outer portion, the side sealing process may be performed by bonding the touch substrate 180 to the thin film transistor substrate 100 and then depositing a material constituting the third adhesive layer 174 on the side.

When the third adhesive layer 174 is formed through a side sealing process, the outer portions of the thin film transistor substrate 100 and the touch substrate 180 may be more securely fixed. Therefore, the thin film transistor substrate 100 and the touch substrate 180 may be prevented from moving more securely though the third adhesive layer 174. Also, even in the case that external impact occurs in the thin film transistor substrate 100 and the touch substrate 180, the possibility of damage may be reduced.

An adhesive material having the same flexibility as that of the first adhesive layer 171 may be used as the deposited material constituting the third adhesive layer 174. However, an adhesive material including the same rigid material as that of the second adhesive layer 171 may be used as the deposited material constituting the third adhesive layer 174 to prevent the thin film transistor substrate 100 and the touch substrate 180 from moving more securely.

Figure 8:
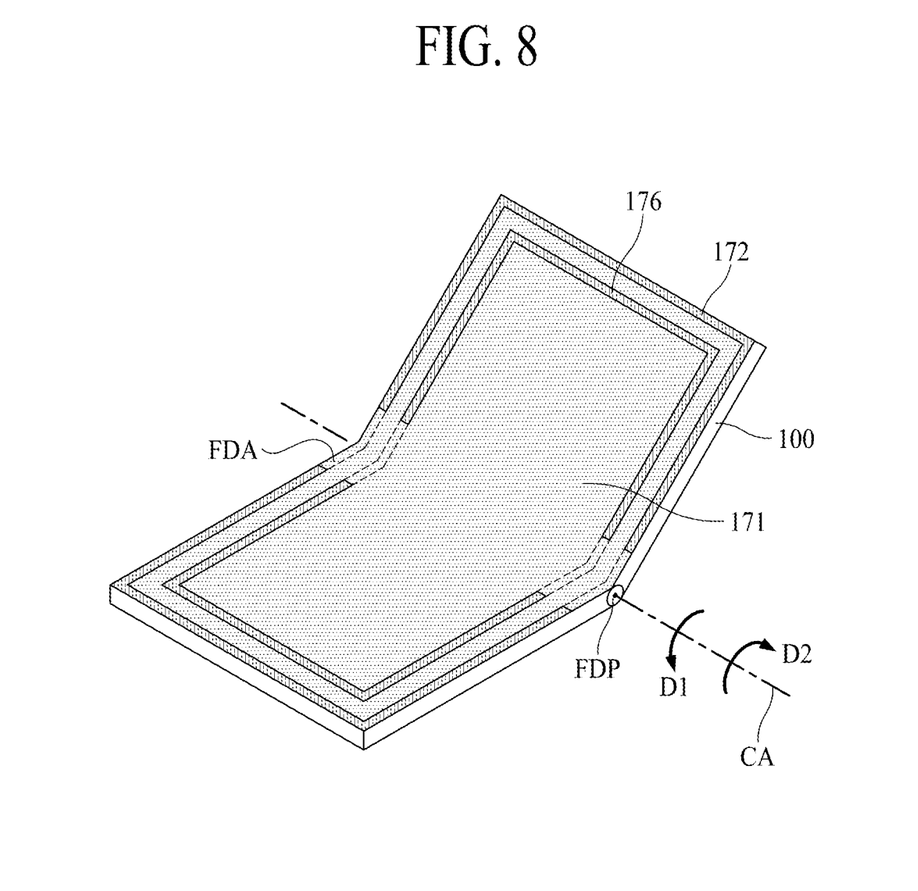
FIG. 8 is a perspective view illustrating a thin film transistor substrate, a first adhesive layer, and a second adhesive layer of a foldable display device according to another aspect of the present disclosure.

FIG. 8 is a perspective view illustrating a thin film transistor substrate 100, a first adhesive layer 171, and second adhesive layers 172 and 176 of a foldable display device according to another aspect of the present disclosure.

The first adhesive layer 171 according to the present disclosure is fully arranged on the display area DA and the folding area FDA. The first adhesive layer 171 is arranged on the display area DA and therefore, is formed of a transparent material. Also, the first adhesive layer 171 is arranged on the folding area FDA and therefore, is formed of a flexible material so as not to interrupt bending of the folding area FDA.

The thin film transistor substrate 100 and the second adhesive layers 172 and 176 of the foldable display device according to another aspect of the present disclosure is the same as the thin film transistor substrate 100 of the foldable display device according to one aspect of the present disclosure described with reference to FIG. 6 except the second adhesive layers 172 and 176. Therefore, description of the same elements will be omitted below.

The second adhesive layers 172 and 176 according to another aspect of the present disclosure are arranged in a double straight shape. Among the second adhesive layers 172 and 176, the second adhesive layer 172 arranged outside the thin film transistor substrate 100 is the same as the second adhesive layer 172 of the foldable display device according to one aspect of the present disclosure described with reference to FIG. 6. The second adhesive layers 172 and 176 according to another aspect of the present disclosure have another second adhesive layer 176 in the inside of them.

The second adhesive layer 176 arranged inside is arranged to be spaced apart from the second adhesive layer 172 arranged on the outside. The second adhesive layer 176 arranged inside may be arranged on the non-display area NDA, or may be arranged on the display area DA. When the second adhesive layer 176 arranged inside is arranged on the display area DA, the second adhesive layer 176 may be formed of a transparent material.

The second adhesive layers 172 and 176 are formed in the same form. Also, both of the second adhesive layers 172 and 176 include a rigid material. Both of the second adhesive layers 172 and 176 are not formed on the folding area FDA.

When the second adhesive layers 172 and 176 are arranged in a double straight shape, a prevention effect of mobility of the thin film transistor substrate 100 and the touch substrate 180 is increased even more due to the second adhesive layers 172 and 176. Also, a damage of internal elements of the thin film transistor substrate 100 and the touch substrate 180 may be avoided more securely.

Figure 9:
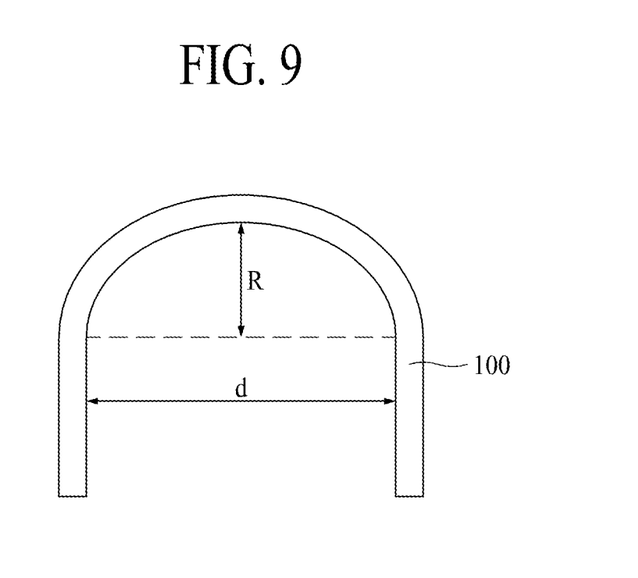
FIG. 9 is a side view illustrating that a foldable display device according to the present disclosure is bent.

FIG. 9 is a side view illustrating that a foldable display device according to the present disclosure is bent.

The foldable display device according to the present disclosure changes and sets an area for not depositing the second adhesive layer 172 in accordance with a diameter 'd' on the central axis of the folding point FDP and a curvature 'R' at the folding point FDP.

In the thin film transistor substrate 100, the folding point FDP is bent based on the central axis. In this case, the area where the second adhesive layer 172 is not deposited should have a margin greater than a circumference of a half circle. The margin may increase in proportion to increase of a curvature, a diameter 'd', and a circumference of a half circle.

For example, a curvature, a diameter 'd', and a circumference of a half circle may have a relationship as shown in Table 1 below.

TABLE 1

|  | Curvature | | | | |
| --- | --- | --- | --- | --- | --- |
|  | 0.5R | 1R | 1.5R | 2R | 2.5R |
| Diameter (d) | 1 mm | 2 mm | 3 mm | 4 mm | 5 mm |
| Cir- | 1.57 mm | 3.14 mm | 4.71 mm | 6.28 mm | 7.85 mm |

TABLE 1-continued

| | Curvature | | | | |
|---|---|---|---|---|---|
| | 0.5R | 1R | 1.5R | 2R | 2.5R |
| cumference of a half circle | | | | | |

Figure 10A:
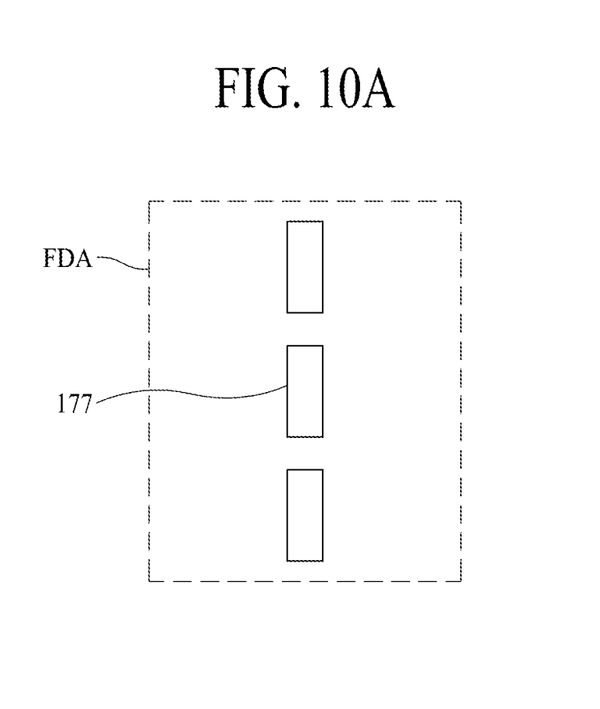
FIGS. 10A to 10C are plane views illustrating folding areas according to the aspects of the present disclosure.
Figure 10B:
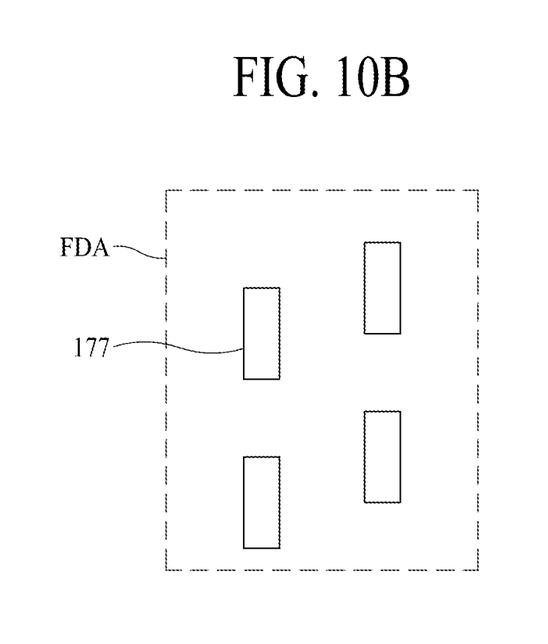
Figure 10C:
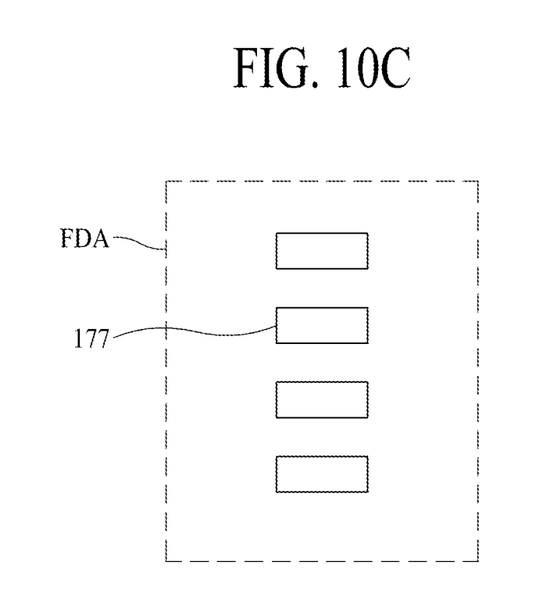

FIGS. 10a to 10c are plane views illustrating folding areas FDA according to the aspects of the present disclosure. The folding area FDA according to the aspects of the present disclosure includes an adhesive pattern 177.

The adhesive pattern 177 according to the aspects of the present disclosure is arranged on the folding area FDA in a dotted line shape or a pattern shape. For example, the adhesive pattern 177 may be provided with a bar shape extended in a direction of the second adhesive layer 172 in the folding area FDA as shown in FIG. 10a. Or, the adhesive pattern 177 may be arranged with a bar shape of a zigzag arrangement in the folding area FDA as shown in FIG. 10b. Or, the adhesive pattern 177 may be provided with a shape extended in a direction of the central axis in the folding area FDA as shown in FIG. 10c.

The adhesive pattern 177 bonds the thin film transistor substrate 100 with the touch substrate 180 on the folding area FDA. The adhesive pattern 170 may be formed of an adhesive material of the same flexibility as that of the material constituting the first adhesive layer 171. The adhesive pattern 177 may be formed of an adhesive material including the same rigid material as the material constituting the second adhesive layer 172.

When the adhesive pattern 177 is arranged on the folding area FDA, a force of the thin film transistor substrate 100 and the touch substrate 180 to resist external impact in the folding area FDA is increased. Also, the problem that the thin film transistor substrate 100 and the touch substrate 180 are separated from each other is solved by the adhesive pattern 177. Since the adhesive pattern 177 is not formed continuously, a folding function in the folding area FDA is maintained.

Figure 11:
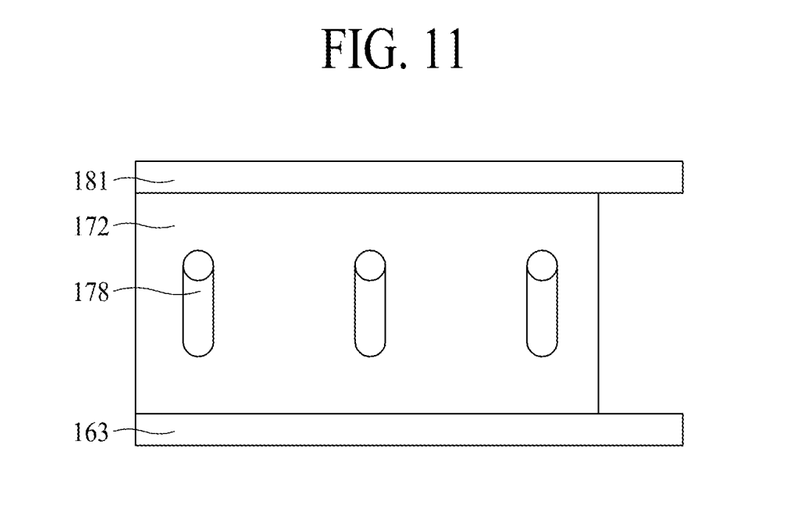
FIG. 11 is a plane view illustrating a second adhesive layer 172 according to another aspect of the present disclosure.

FIG. 11 is a plane view illustrating a second adhesive layer 172 according to another aspect of the present disclosure.

The second adhesive layer 172 according to another aspect of the present disclosure includes a glass fiber 178.

The glass fiber 178 serves as a rigid material in the second adhesive layer 172. The glass fiber 178 is formed of at least one piece of a cylinder and is included inside the second adhesive layer 172. However, without limitation to this case, the glass fiber 178 may be formed of a shape connected in one-piece. The glass fiber 178 may be formed of a tempered glass with a high degree of strength. The glass fiber 178 increases rigidity of the second adhesive layer 178.

When rigidity increases by adding the glass fiber 178 to the second adhesive layer 172, the second adhesive layer 172 may prevent mobility between the transistor substrate 100 and the touch substrate 180 from occurring more securely. Therefore, a protective effect of the transistor substrate 100 and the touch substrate 180 using the second adhesive layer 172 may be increased even more.

Figure 12:
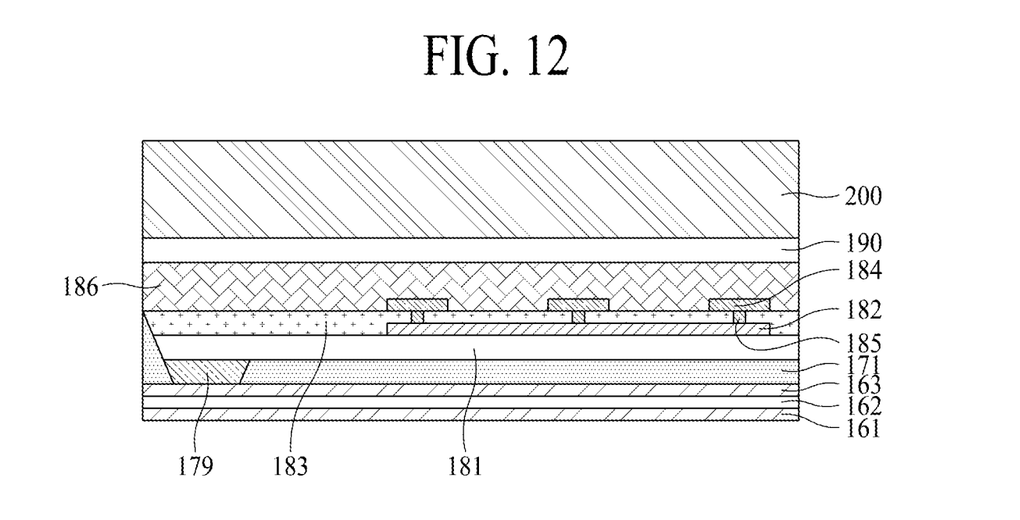
FIG. 12 is a cross-sectional view specifically illustrating a first inorganic film, an organic film, a second inorganic film, a first adhesive layer, a photo-hardening adhesive pattern, a touch substrate, a polarizing film, and a cover window of a foldable display device according to other aspect of the present disclosure.

FIG. 12 is a cross-sectional view specifically illustrating a first inorganic film, an organic film, second inorganic films 161, 162 and 163, a first adhesive layer 171, a photo-hardening adhesive pattern 179, a touch substrate 180, a polarizing film 190, and a cover window 200 of a foldable display device according to other aspect of the present disclosure.

The foldable display device according to other aspect of the present disclosure has the same structure as that of the foldable display device described with reference to FIG. 5 except that the second adhesive layer 172 changes into the photo-hardening adhesive pattern 179. Therefore, description of the same elements will be omitted below.

In the foldable display device according to other aspect of the present disclosure, the photo-hardening adhesive pattern 179 is used instead of the second adhesive layer 172. The photo-hardening adhesive pattern 179 includes a rigid material. The rigid material included in the photo-hardening adhesive pattern 179 is a photo-hardening material. When light is irradiated, a structure and a function of the photo-hardening adhesive pattern are the same as those of the second adhesive layer 172.

Therefore, when light is selectively irradiated to a desired area of areas to which the photo-hardening adhesive pattern 179 is applied, the photo-hardening adhesive pattern 179 may change physical properties to perform the same function as that of the second adhesive layer 172. The photo-hardening adhesive pattern 179 is fully hardened on the areas except the folding area FDA When the photo-hardening adhesive pattern 179 is used, it is possible to form a rigid structure using a photo process. That is, after the touch substrate 180 is bonded to the first and second adhesive layers 171 and 172, the photo-hardening adhesive pattern 179 may be formed by irradiating light to the outside of the first adhesive layer 171 on the thin film transistor substrate 100.

In this case, when a non-deposited area is designed with a compensation, various types of patterns may be designed because the non-deposited area is formed using a photo process. Also, it is possible to realize a structure of the photo-hardening adhesive pattern 179 that may be applied to various types of foldable display devices through a pattern on areas except the display area.

Figure 13:
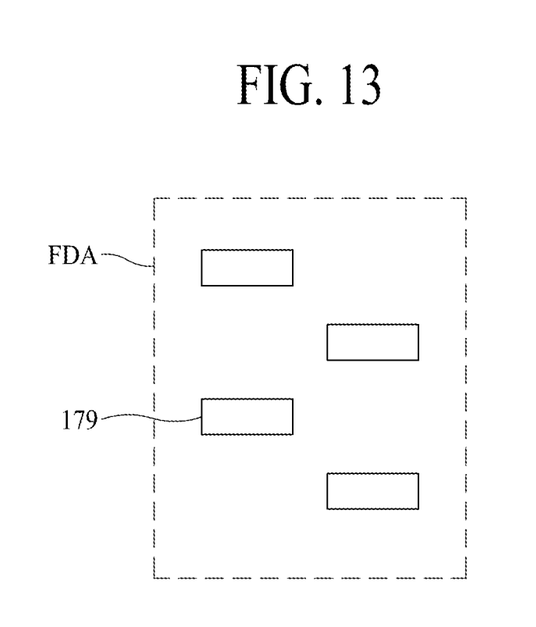
FIG. 13 is a plane view illustrating a folding area according to another aspect of the present disclosure.

FIG. 13 is a plane view illustrating a folding area according to another aspect of the present disclosure.

The photo-hardening adhesive pattern 179 is hardened with a partial patterned form. The photo-hardening adhesive pattern 179 may be arranged with a bar shape arranged in a zigzag shape inside the folding area FDA. When light is irradiated, the photo-hardening adhesive pattern 179 may perform the same function as that of the adhesive pattern 177.

When the second adhesive layer 172 or the photo-hardening adhesive pattern 179 is fully arranged on the folding area FDA, a bending function of the foldable display device is deteriorated. The photo-hardening adhesive pattern 179 is hardened with a partial patterned form on the folding area FDA, whereby a bending function is not deteriorated while an adhesive function of the thin film transistor substrate 100 is being performed on the folding area FDA.

As described above, according to the present disclosure, the following effects and advantages may be obtained.

The present disclosure includes a second adhesive layer including a rigid material on the outer area between the thin film transistor substrate and the touch substrate. The second adhesive layer not only absorbs external impact applied to the thin film transistor substrate and the touch substrate, but also prevents the thin film transistor substrate and the touch substrate from moving, whereby the thin film transistor substrate and the touch substrate are prevented from being damaged. Also, in the present disclosure, the second adhesive layer is not arranged or arranged in a pattern on the folding area, whereby the second adhesive layer may maintain a bending capability in the folding area while having the effect of rigidity reinforcement.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the aspects can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A foldable display device, comprising:
    a thin film transistor substrate;
    a first adhesive layer arranged on the thin film transistor substrate;
    a second adhesive layer arranged outside the first adhesive layer on the thin film transistor substrate;
    a touch substrate arranged on the first and second adhesive layers; and
    a third adhesive layer arranged on sides of the thin film transistor substrate and sides of the touch substrate,
    wherein the second adhesive layer includes a rigid material and is arranged on areas surrounding the first adhesive layer except for a folding area where the thin film transistor substrate is folded.

2. The foldable display device according to claim 1, wherein the second adhesive layer is adjacent to the first adhesive layer.

3. The foldable display device according to claim 1, wherein the second adhesive layer is directly in contact with the first adhesive layer.

4. The foldable display device according to claim 1, wherein the first adhesive layer is fully arranged on a display area and the folding area of the thin film transistor substrate, and the second adhesive layer is arranged on areas outside the first adhesive layer except for the folding area.

5. The foldable display device according to claim 1, wherein the second adhesive layer is arranged in a double straight line shape.

6. The foldable display device according to claim 1, further comprising an adhesive pattern arranged in a dotted line shape or a patterned shape on the folding area provided with a folding member.

7. The foldable display device according to claim 6, wherein the adhesive pattern is formed of the same as the second adhesive layer.

8. The foldable display device according to claim 1, wherein the rigid material includes a glass fiber.

9. The foldable display device according to claim 1, wherein the rigid material includes a photo-hardening material and is fully hardened on the areas except for the folding member and is hardened in a partial patterned form on the folding area provided with the folding member.

10. The foldable display device according to claim 1, further comprising a folding point to fold the thin film transistor substrate.

11. A foldable display device, comprising:
    a thin film transistor substrate;
    a first adhesive layer disposed on the thin film transistor substrate;
    a second adhesive layer including a rigid material and surrounding the first adhesive layer except for a folding area where the thin film transistor substrate is folded;
    a touch substrate arranged on the first and second adhesive layers;
    an adhesive pattern arranged at the folding area; and
    a third adhesive layer arranged on sides of the thin film transistor substrate and sides of the touch substrate.

12. The foldable display device according to claim 11, wherein the second adhesive layer is adjacent to the first adhesive layer.

13. The foldable display device according to claim 11, wherein the second adhesive layer is directly in contact with the first adhesive layer.

14. The foldable display device according to claim 11, wherein the first adhesive layer is fully arranged on a display area and the folding area of the thin film transistor substrate, and the second adhesive layer is arranged on areas outside the first adhesive layer except for the folding area.

15. The foldable display device according to claim 11, wherein the second adhesive layer is arranged in a double straight line shape.

16. The foldable display device according to claim 11, wherein the adhesive pattern has a dotted line shape or a patterned shape on the folding area.

17. The foldable display device according to claim 16, wherein the adhesive pattern is formed of the same as the second adhesive layer.

18. The foldable display device according to claim 11, further comprising a folding point to fold the thin film transistor substrate.

19. A foldable display device, comprising:
    a thin film transistor substrate;
    a first adhesive layer arranged on the thin film transistor substrate;
    a second adhesive layer arranged outside the first adhesive layer on the thin film transistor substrate; and
    a touch substrate arranged on the first and second adhesive layers,
    wherein the second adhesive layer includes a rigid material and is arranged on areas surrounding the first adhesive layer except for a folding area where the thin film transistor substrate is folded,
    wherein the rigid material includes a glass fiber.

20. The foldable display device according to claim 19, wherein the second adhesive layer is adjacent to the first adhesive layer.

21. The foldable display device according to claim 19, wherein the second adhesive layer is directly in contact with the first adhesive layer.

22. The foldable display device according to claim 19, wherein the first adhesive layer is fully arranged on a display area and the folding area of the thin film transistor substrate, and the second adhesive layer is arranged on areas outside the first adhesive layer except for the folding area.

23. The foldable display device according to claim 19, wherein the second adhesive layer is arranged in a double straight line shape.

24. The foldable display device according to claim 19, further comprising an adhesive pattern arranged in a dotted line shape or a patterned shape on the folding area provided with a folding member.

25. The foldable display device according to claim 24, wherein the adhesive pattern is formed of the same as the second adhesive layer.

\* \* \* \* \*